(12) United States Patent
Sandstrom et al.

(10) Patent No.: US 6,883,158 B1
(45) Date of Patent: Apr. 19, 2005

(54) METHOD FOR ERROR REDUCTION IN LITHOGRAPHY

(75) Inventors: Torbjorn Sandstrom, Pixbo (SE); Peter Ekberg, Lidingo (SE); Per Askebjer, Akersberga (SE); Mats Ekberg, Vasteras (SE); Anders Thuren, Taby (SE)

(73) Assignee: Micronic Laser Systems AB, Taby (SE)

( * ) Notice: Subject to any disclaimer, the term of this patent is extended or adjusted under 35 U.S.C. 154(b) by 0 days.

(21) Appl. No.: 09/979,148

(22) PCT Filed: May 22, 2000

(86) PCT No.: PCT/SE00/01030

§ 371 (c)(1),
(2), (4) Date: Nov. 20, 2001

(87) PCT Pub. No.: WO00/72090

PCT Pub. Date: Nov. 30, 2000

(30) Foreign Application Priority Data

May 20, 1999 (SE) .............................................. 9901866

(51) Int. Cl.$^7$ .............................................. G06F 17/50
(52) U.S. Cl. ............................ 716/19; 716/21; 700/121
(58) Field of Search ...................... 716/19, 21; 700/121

(56) References Cited

U.S. PATENT DOCUMENTS

| | | | | |
|---|---|---|---|---|
| 623,447 A | * | 4/1899 | Vogt et al. .................. 423/507 |
| 4,442,361 A | * | 4/1984 | Zasio et al. ............... 250/491.1 |
| 5,773,836 A | * | 6/1998 | Hartley ..................... 250/491.1 |
| 5,790,253 A | * | 8/1998 | Kamiya ........................ 356/500 |
| 5,798,947 A | * | 8/1998 | Ye et al. ........................ 702/95 |
| 5,815,685 A |   | 9/1998 | Kamon |
| 5,841,520 A | * | 11/1998 | Taniguchi ..................... 355/53 |
| 6,035,113 A | * | 3/2000 | Gerber et al. .................. 716/19 |
| 6,064,486 A | * | 5/2000 | Chen et al. .................. 356/401 |
| 6,169,960 B1 | * | 1/2001 | Ehrichs ........................ 702/36 |
| 6,355,387 B1 | * | 3/2002 | Fujinaga et al. .............. 430/30 |
| 6,406,818 B1 | * | 6/2002 | Zemen et al. .................. 430/5 |
| 6,424,879 B1 | * | 7/2002 | Chilese et al. ............. 700/121 |
| 6,501,532 B1 | * | 12/2002 | Suzuki ........................ 355/53 |

FOREIGN PATENT DOCUMENTS

EP          0307726 A2      3/1989

* cited by examiner

Primary Examiner—Stacy A. Whitmore
(74) Attorney, Agent, or Firm—Harness, Dickey & Pierce, P.L.C.

(57) ABSTRACT

The present invention relates to a method and a system for predicting and correcting geometrical errors in lithography using masks, such as large-area photomasks or reticles, and exposure stations, such as wafer steppers or projection aligners, printing the pattern of said masks on a workpiece, such as a display panel or a semi-conductor wafer. The method according to the invention comprises the steps of collecting information about a mask substrate, a mask writer, an exposure stati n, and/or about behavior of a processing step that will occur after the writing of the mask. Further the method comprises predicting from the combined information distorsions occuring in the pattern, when it is subsequently printed on the workpiece; calculating from said prediction a correction to diminish said predicted distorsion, and exposing said pattern onto said mask substrate while applying said correction for said distorsions.

38 Claims, 11 Drawing Sheets

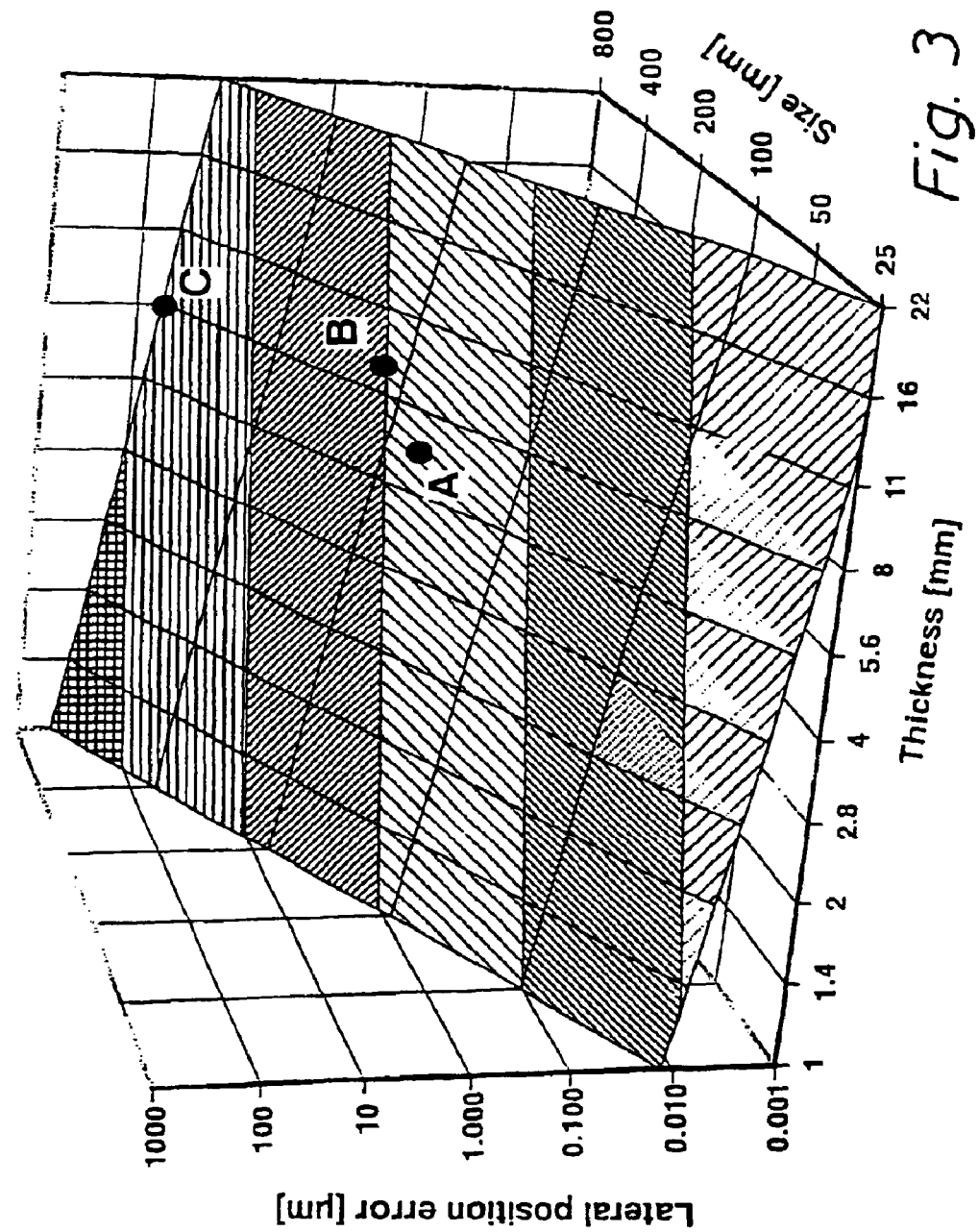

ically 152×152×6.25 mm and the patterned area may
METHOD FOR ERROR REDUCTION IN LITHOGRAPHY This application is the national phase under 35 U.S.C. § 371 of PCT International Application No. PCT/SE00/01030 which has an International filing date of May 22, 2000, which designated the United States of America and was published in English.

FIELD OF THE INVENTION

The invention relates to production and precision patterning of photomasks and use of such photomasks in microlithography, for example in the production of flat panel displays and semiconductor circuits. Errors in the pattern on the display panel or semiconductor chip can be separated into errors from systematic sources, from the interaction of maskblank and pattern with the equipment, and from random fluctuations. The invention relates to the reduction of these errors. In a different sense the invention relates to the characterization of the photomask substrate and the equipment and processes used with a photomask, the storage and retrieval of information obtained by such characterization, and the generation of corrections to be applied at the time of writing the photomask in order to reduce imperfections in lithography using photomasks.

BACKGROUND

The development of semiconductor lithography has been exponential since the early 60ies and the produced features are getting smaller every second or third year, at the same time as the circuits get faster and more complex. FIG. 1 shows an industry projection of the development for some years forward. Of course the predictions are less certain the farther into the future we look and nobody knows if the electronics industry will still be using transistors in the year 2020. For the next 10 years the projections are more certain and the main uncertainty relates not to "How small?" but to "Exactly when?".

The errors in lithography can broadly be classified as placement and size errors, or "registration" and "critical dimension", ("CD") in the jargon of the trade. There is a more or less fixed relation between the errors that can be allowed in the pattern and the size of the smallest features in the pattern. A rule of thumb is that on the mask the placement of figures has to be within 5% of the design rule and the size of the features should be within 2.5%. These are surprisingly small numbers, but have been justified by both theory and experiments. FIG. 1 also shows the necessary registration and CD (size) control on the mask for each year, assuming that 4X masks will continue to be used. It is seen that the errors are now 1999 in the low tens of nanometers and will in less than 15 years be ten times smaller. At the same time then chips will be larger which means either larger masks or less reduction. Either way it will be difficult to achieve the needed pattern fidelity.

The invention devises a new general method to reduce errors in the lithography in order to achieve total errors that are consistent with the projected lithography development. An important application is for the reduction of clamping errors, being both an important error source and a good example of errors caused by the interaction of several factors.

Clamping Errors

When a glass plate is held it is deformed by the holding device and by its own weight. Furthermore, it can also be distorted by the built-in stress in surface films deposited on it and by the patterning of said films. Semiconductor masks are typically 152×152×6.25 mm and the patterned area may be 127×127 mm. FIG. 2b shows how the bending of a plate 201 under the force of gravitation causes the upper area of the glass to contract. When the plate is released, e.g. held vertically, it springs back to its natural shape, shown in FIG. 2a, and contraction disappears. If a pattern was written on the plate while it was bent, the pattern will be stretched after relief. FIG. 3 shows a diagram with the resulting maximum error when a plate is supported along two opposite edges, as in FIG. 2. Here, the expected lateral position error is shown as a function of the thickness of the plate and the size, i.e. the distance between the two supported sides. The interesting conclusion from FIG. 3 is that the magnitude of errors that can result from inappropriate support of a glass plate is in order of magnitude larger than what is allowable in a high-end mask. Point A shows a standard semiconductor reticle 152×152×6.25 mm and the maximum deviation is around 400 nm. Point B is the new standardised mask format 225×225×9 mm and, despite the fact that the glass plate is thicker, the deviation is above 1 $\mu$m. Point C finally illustrates that for large-area masks the problem is even worse: an 800 mm plate 8 mm gives a possible error of 60 $\mu$m. It is also seen from FIG. 3 that increasing the thickness of the glass plate is a weak remedy. It is impossible to,increase the thickness of the 800 mm plate to bring the error down to 0.1 $\mu$m. The same is valid for the 225 mm mask in B: even a glass cube with the side 225 mm has deviations larger than 10 nm.

I conclusion FIG. 3 shows the magnitude of the gravitational deformation and it shows how everything becomes more difficult for larger mask sizes.

Other Errors

Clamping deformation gives a placement or registration error. Another large source of placement errors in the finished product is the distorsion in the exposure tool, be it a wafer stepper for semiconductors or a projection aligner for display panels. The maskwriter has stage errors, but these are usually well controlled after calibration to a xy metrology system, such as those made commercially available by Nikon and Leica. The placement can also be affected by processing, both because films deposited on or removed from a workpiece have built-in stress and deform the workpiece, and because some process steps cause a shrinkage or warping of the workpiece, e.g. high temperature annealing steps. An important source of errors is the pellicle used on masks. Fitting the frame to the mask plate causes the mask plate to bend.

Other effects make the size of the pattern features come out differently at different location on a mask or on a chip or display panel. There are several possible mechanisms behind this: uneven focus, non-uniform developer agitation, non-uniform photoresist thickness, uneven chrome properties on the mask and uneven film thickness on a wafer or panel, exposure dose variations in the exposure tools, effects of the time between the exposure and development or between resist coating and exposure and effect from non-perfect pre-exposure and post-exposure baking procedures. Size errors also occur because of the basic imaging properties of mask writer and the exposure station. In particular small features tend to come out too small due to finite resolution and features are affected by the presence of other features in the neighbourhood due to stray exposure. These types of size errors are also intimately coupled to shape errors, such as shortening of line ends and rounding of corners. The exact details of the mask and wafer exposure tools also interact with the pattern and create for example grid snap effects, and spurious pattern features.

Mix and Match

The term used in the mask industry is "registration" which really means misregistration from a reference grid, normally an ideal mathematical grid. In the past registration of the finished product to an ideal mathematical grid has not been necessary. If all layers (approximately 25 in a semiconductor chip and 6 in a TFT) are printed using the same type of exposure station systematic and equal behaviour of the exposure stations will cancel, since every layer is distorted in the same way.

However, when resolution is pushed in order to achieve circuit speed and packing density the cost of lithography is rising rapidly, both because of higher tool cost and because of more expensive masks. To make production economical the display and chip manufacturers are trying not to use more sophisticated technology than needed for each layer, so called mix-and-match. Different layers can be printed using different types of exposure tools with different error characteristics. Furthermore the masks may be of different type, e.g. phase-shifting masks for one layer and standard binary masks on another layer. The different types of masks may require them to be written on different maskwriters.

The management of errors is made more complicated by the fact that the exposure tools for critical and non-critical layers may not even have the same exposure field. FIG. 4 shows dies formed on a semiconductor wafer using tools with different fields. The critical layers like the transistor layers are printed with a tool that has a field that accommodates only one die, FIG. 4a. Less critical layers, such as the top metal layers, are printed with a different stepper having a larger field and possibly a different mask reduction factor, FIG. 4b. One or both of the layers can be exposed by a step-and-scan tool, and if both use step and scan they may very well have the scan direction at right angle to each other. Furthermore, it is anticipated that in the future a single die will be exposed in two or more scanning strokes using a so called stitching scanner, FIG. 4c.

In the past the thinking has been that the masks should be as close to perfect, i.e. as close to the ideal mathematical grid, as possible. Then the masks for different layers can be written on different types of mask-writers or even by different mask making companies for best economy and logistics. When all masks are exposed on the same stepper, or on steppers of the same type, the systematic errors in the stepper will largely cancel. This breaks down in the mix-and-match scenario of FIG. 4a–c. The only straightforward way to resolve the complicated overlay properties of layers printed in different ways is to make each layer print an image that is close to the mathematically ideal.

The invention gives a method to predict the printing errors in a specific exposure station and correct it beforehand by predistorting and prebiasing the pattern in the opposite sense. In this application is described a practical method to manage the lithographic errors al the way to the finished product, and also in the presence of non-ideal mask blanks and clamping structures.

OBJECT OF THE INVENTION

It is therefore an object of the present invention to provide a method for predicting and correcting geometrical errors in lithography in order to achieve an improved precision.

This object is achieved with a method according to the appended claims.

BRIEF SUMMARY OF THE DRAWINGS

FIG. 3 shows the maximum lateral displacement in the arrangement of FIG. 1b as a function of plate size and thickness. The shaded areas show the resulting error.

DESCRIPTION OF THE INVENTION

Figure 1:
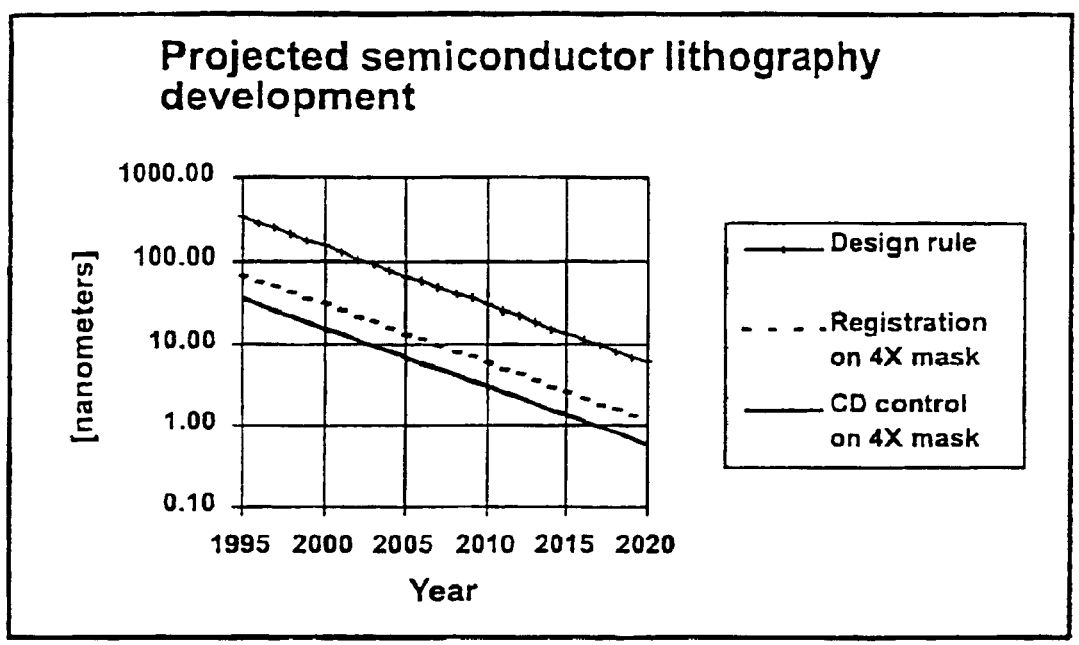
FIG. 1 gives a projection of future lithography and the requirements on placement (registration) and size (CD).
Figure 2A:
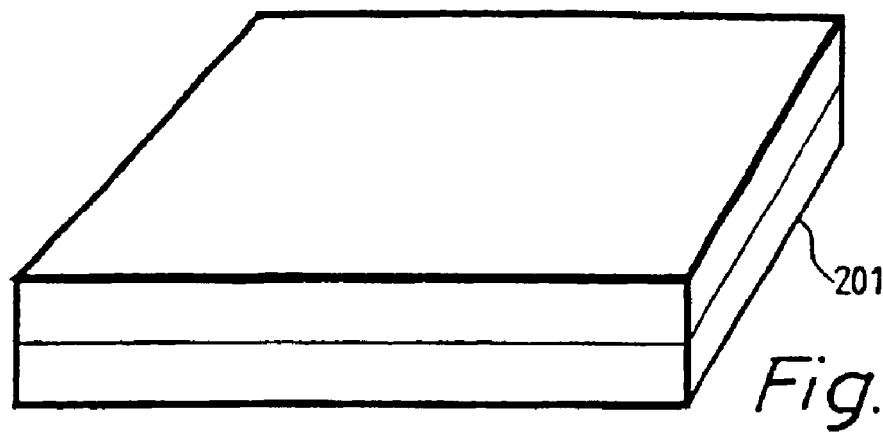
FIG. 2a shows a plate, e.g. a mask substrate.
Figure 2B:
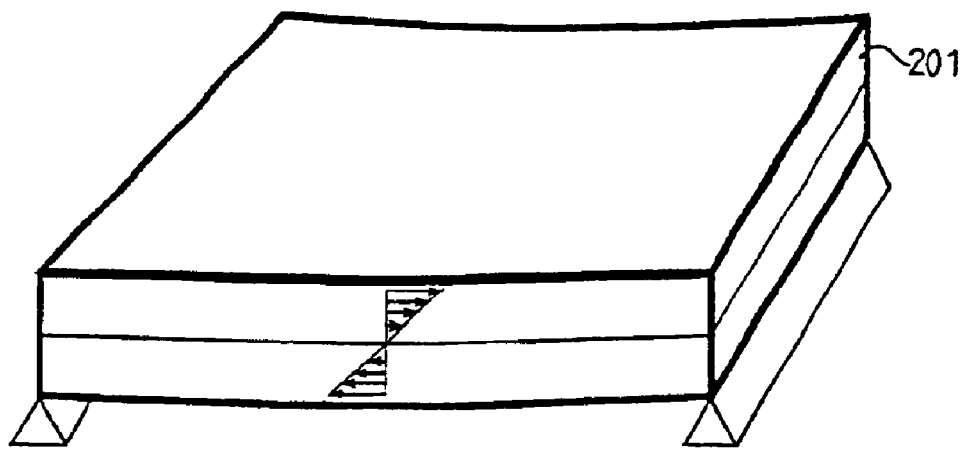
FIG. 2b shows the same plate supported at two sides and the contractive stress above and the tensile stress below the neutral layer which keeps its length when the plate is bent.
Figure 2C:
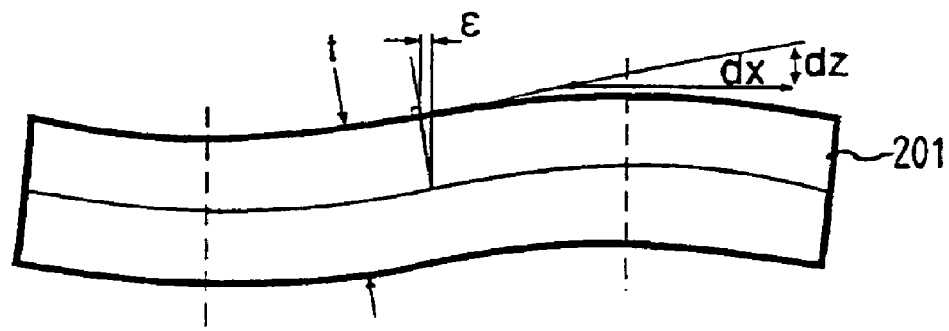
FIG. 2c shows the lateral displacement resulting from a bent plate and how it is related to the dz/dx of the surface.
Figure 4A:
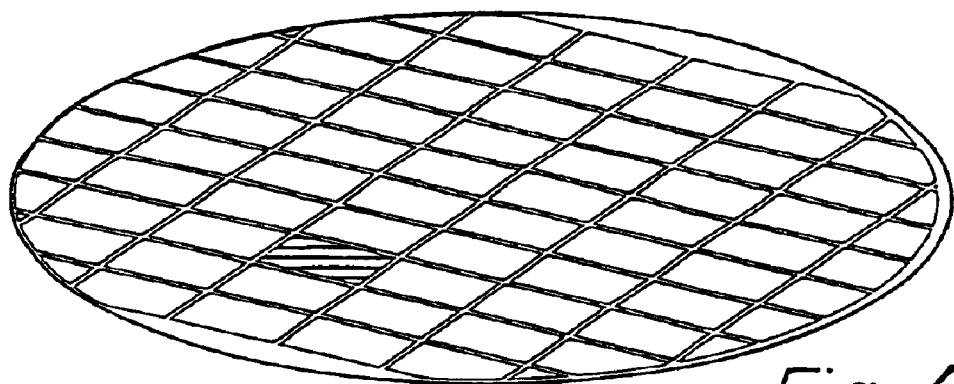
FIG. 4a–c shows dies formed on a semiconductor wafer using tools with different fields, so called mix-and-match lithography.
Figure 4B:
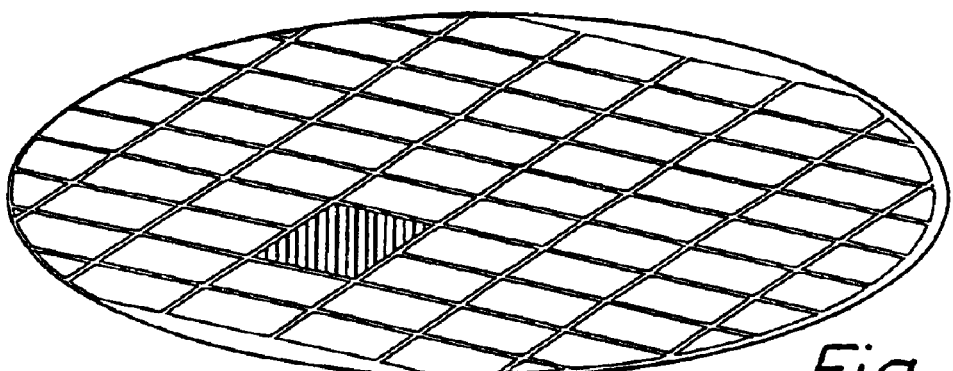
Figure 4C:
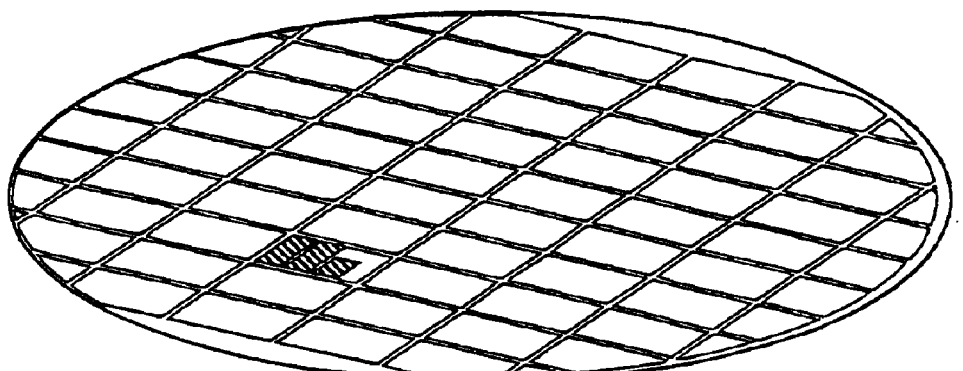
Figure 5:
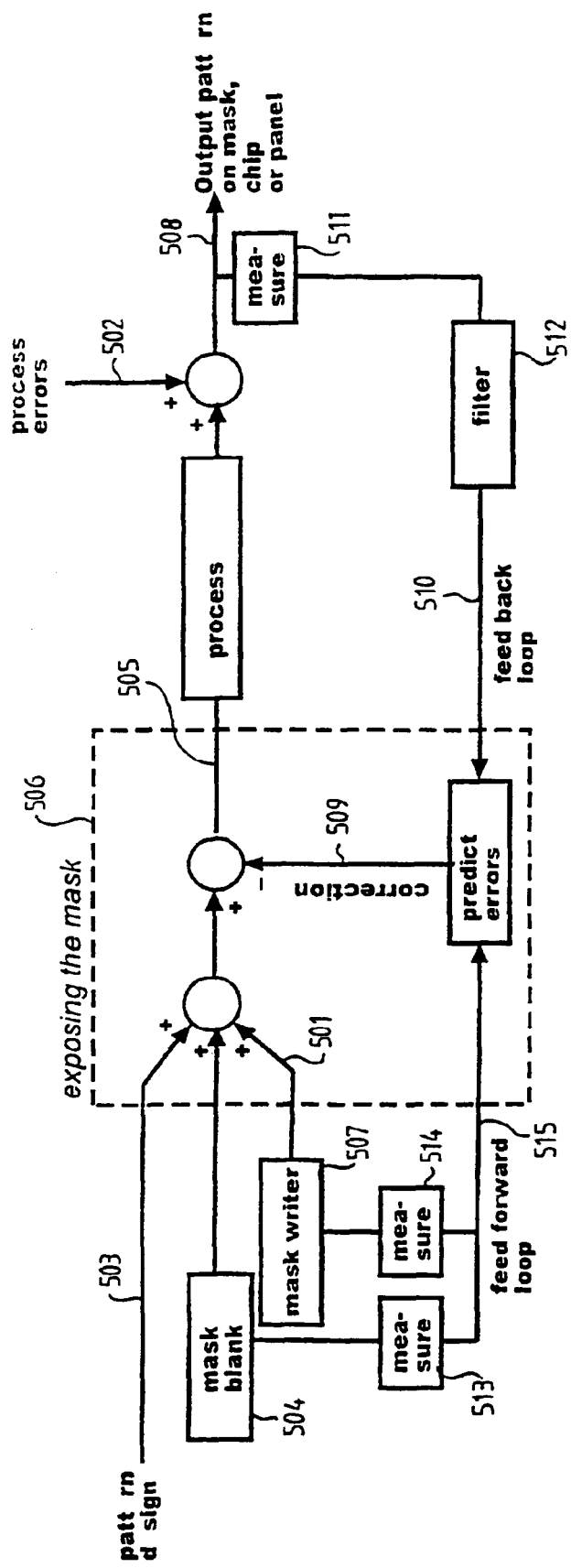
FIG. 5 shows schematically a control method according to the invention.

The invention is best described as a control system, such as is shown in FIG. 5. The pattern picks up errors 501, 502 of different kinds when it is converted from a design data file 503 and a mask blank 504 to a mask 505 during a mask writing procedure 506, i.e. exposure, by means of a mask writer 507. The mask is thereafter used to produce an electronic device 508. The pattern file describes what the chip or panel designer wants to see printed and any deviation is to him an error. One part of these errors is that systematic and other errors are different from one time to another. The invention is based on the identification of different types of errors and the appropriate way to reduce each type. Errors that can be found in the output from the system and identified to be recurring in a systematic fashion are reduced by feeding an inverse error 509 back to the writing of the mask. This is the feed-back loot 510 in FIG. 5. The feed-back can be pseudo-continuous, i.e. corrections are made after each written mask, or intermittently. The error is measured by a measuring means 511, and a filter 512 is useful to keep the feed-back from fluctuation with the noise component of the measured error. The low-pass filter 512 can use a very simple procedure: use the average of five measurements over five days for setting the first feed-back, then change it only when the running average over five consecutive measurement are outside of predetermined tolerance interval. On the other hand it can be based on more sophisticated statistics such as time series estimations and feed back an appropriately filtered correction for each measurement of the output errors. More elaborate statistics can be used to cancel slow changes in the properties of the total system without ever producing a rejected part, or to extract error components with different characteristics. A statistician skilled in the art can set up statistical process control (SPC)

procedures that tunes the system without interrupting the production flow.

Figure 12:
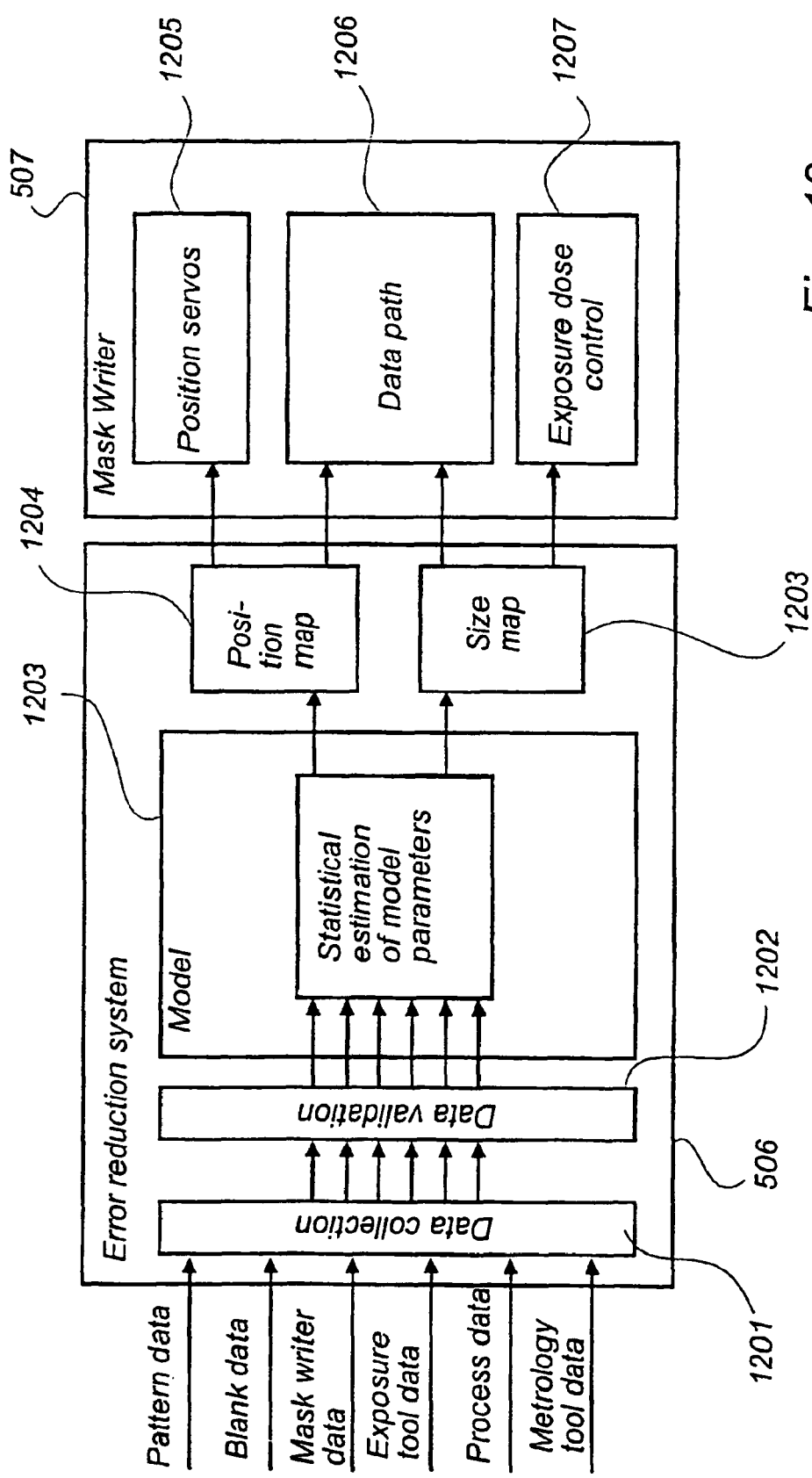
FIG. 12 is a schematic view illustrating the correction in the embodiment in FIG. 5 in more detail.

In FIG. 12 the correction system provided in the embodiment described above with reference to FIG. 5 is illustrated in more detail. Input data is transferred to a data collection unit 1201 in the error reduction system 506. As will be described more in detail in the following, such input data could be one, or preferably several, and most preferably all, of the following: pattern (design) data, blank data mask writer data, exposure tool data, process data and metrology tool data. The input data is then forwarded to a data validation unit 1202, where the data is validated. The validated data is then 35 transferred to error prediction unit 1203 comprising a model, for a statistical estimation of model parameters. Correction data is then output as a position correction map 1204 and/or a correction size map 1203, for correction of pattern element position and pattern element size, respectively.

The correction mass are forwarded to the mask writer 507. One or both of the correction maps could be forwarded to the data path 1206 in the mask writer 507 for correction of the data provided from the pattern data file, and thus correcting said distorsion. The altering of the input design data could hereby preferably be made in at least one processor, and preferably in several such processors. Alternatively, or as a complement, the position correction map could be forwarded to the position servos 1205 controlling e.g. the support table supporting the mask substrate during the writing process. In this case, the correction map implies a correction of the position control for the servo system, and thereby the position of the pattern on the substrate. Alternatively, or as a complement, the size correction map could be forwarded to an exposure dose control 1207, such as a dose modulator. Hereby, a correction of the dose according to the predicted correction map could be provided during the exposure.

There are in principle four driving forces for errors: the physical properties of the substrates on which the patterns are printed, i.e. the mask blanks and the wafers or panels, the position on the substrate, the exposing equipment (which can be using electromagnetic radiation or particle beams as the exposing medium) including exposing sequence and environment, and the pattern itself. These driving forces interact with each other directly of via the production processes to create errors. An important feature of the invention is the use of models to translate measured or previously known physical parameters to a placement, size or shape error to be corrected. An example is a plasma etcher. The plasma is non-uniform towards the edges of the substrate and in local areas where the surface exposed to the plasma is different from other places in the pattern. This creates a position- and pattern-dependent size error. It can however be characterised with a small number of parameters, such as an edge fall-off magnitude and typical length, and a sensitivity and disturbance length for pattern variations. Using this model with four-parameters it is possible not only to precompensate for the edge fall-off, which is equal from plate to plate, but also for the local variation which vary with the patterns.

Using a model-based error prediction makes it possible to account for a large number of different error mechanisms with a manageable amount of empirical data collection. Designing sampling and measurement plans that effectively fit the parameters of a model from a limited number of measurements is known in the art, and can be found in textbooks on experimental design. It is also known how to design plans to separate between different driving forces.

The ideal situation is that measurement are made non-destructively on production masks and wafers, but for a specific model it may be more efficient to use a special monitor substrate, i.e. to be able to distribute a matrix of test structures over the entire surface.

Figure 6:
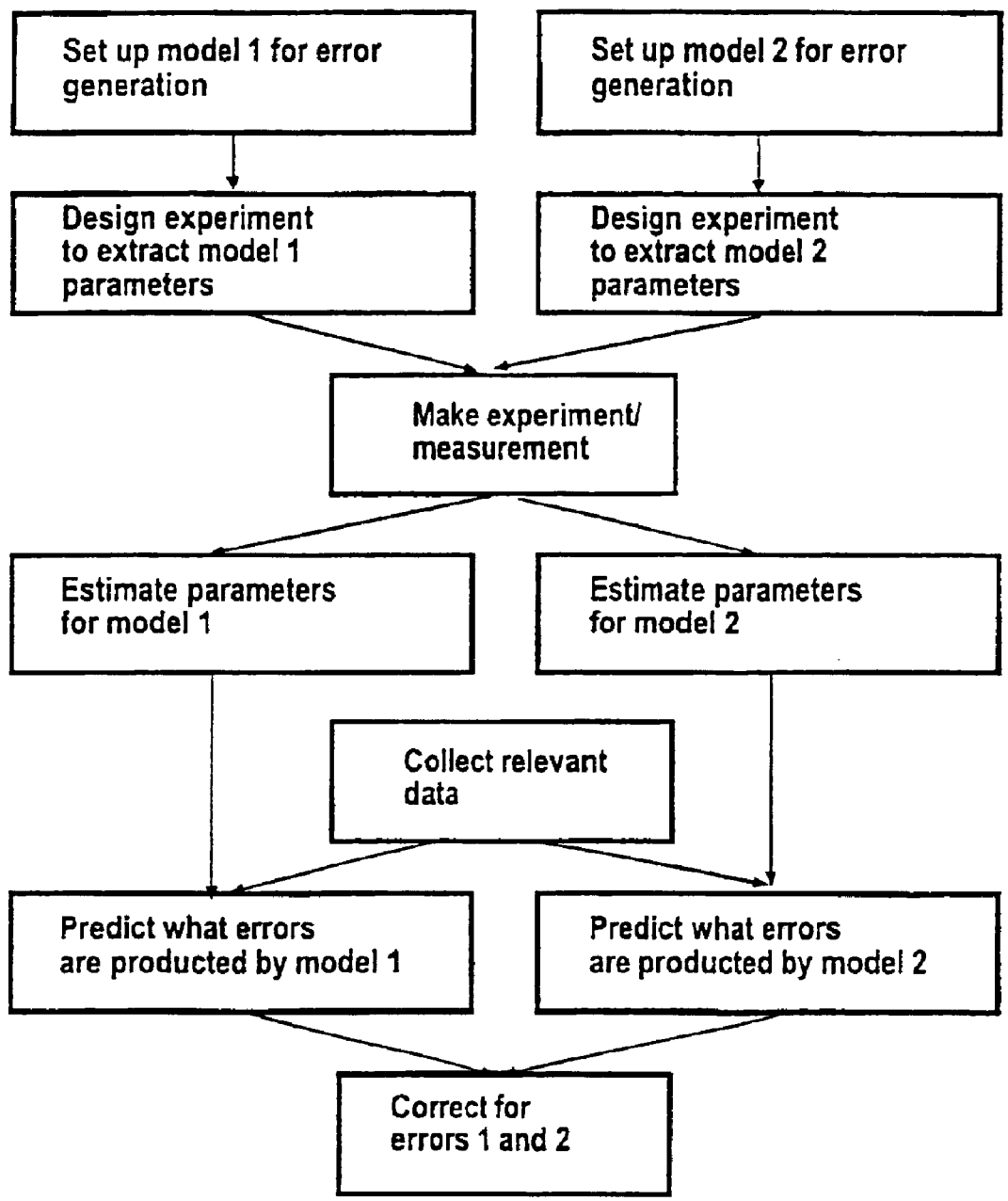
FIG. 6 snows flow chart describing the development of models and how the models are used to predict and correct errors.

The model-based error prediction is further described in FIG. 6. Two different mechanisms for generation of errors are set up, e.g. edge falloff and pattern dependent etch activity in an etch step. A measurement is designed which can find the parameters for each and separate between them. In this example it can be measuring features in areas with three densities each at three locations, inside, intermediate, and close to the edge of the substrate. The measurement is done and the parameters extracted. Before writing and correcting a pattern relevant information has to be collected in this case the pattern density in different areas of the pattern and the distance of pattern areas to the edge of the substrate. The total correction is generated, in most cases by superposition of the corrections for the two mechanisms, other times by a more complicated summation.

Figure 8:
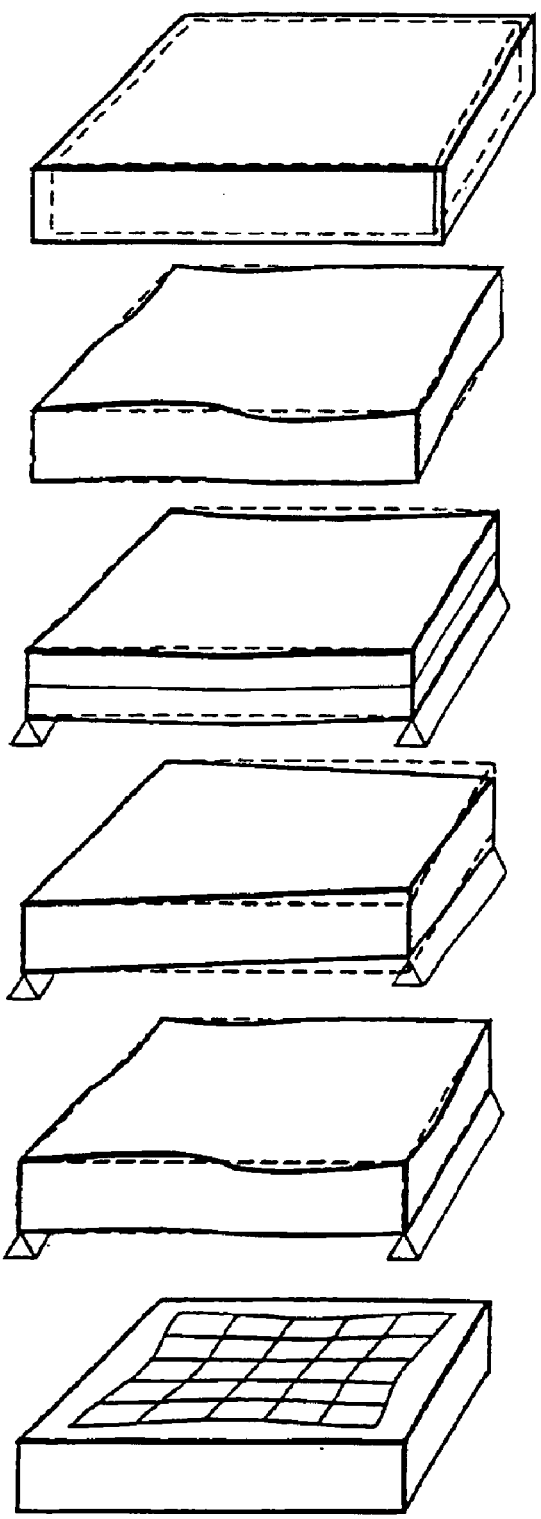
FIG. 8 shows how the plate and/or the pattern is affected by different types of errors.

Another aspect of model-based error correction is shown in FIG. 8, namely decomposition of complicated error behaviour into a set of independent and computable error mechanisms. The general geometrical error in a mask writer is very complicated, but it can be decomposed into isotropic expansion, built-in shape, gravitation sag, clamping deformation due to non-ideal geometry of the clamping structure, and interaction between the built-in shape and the clamping geometry. If each error is small, which is the case for lithographic substrates, the contributions can be superposed. On top of it come the stage errors, i.e. errors in the coordinate system of the writer.

An important case of model-based error correction is when a chip has a CD error towards the edge, for example due to stray light. If a 0.18 feature is 3% percent too small one would expect that a +3% size correction in the mask would compensate it perfectly. However, due to the finite resolution of a stepper there is a more complicated function relating size on the mask to, size on the wafer, the so-called "Mask Error Enhancement Factor", MEEF. The enhancement factor is size dependent and depends on the details of the tools and process. Therefor a model need to be used that takes the MEEF into account, and the corrections will not be correct until the MEEF model has been verified a couple of turns around the feedback loop.

Process errors 502, if they can be held constant, can in principle be corrected with the feedback loop. Other errors 501 are impossible to correct by feedback, because they are not constant in time. In the invention one important such error has been identified as the clamping distortion of the mask in the mask writer, the metrology system and in the exposure station that uses the masks. At first sight the clamping errors seem uncontrollable, but we have found that they can be predicted from accurate geometrical data for the mask blank itself and the clamping structure of equipment using or operating on the mask. Another seemingly random error source that is controlled in another embodiment of the invention is variations in linewidth due to variations in resist and chrome properties over the mask substrate. Using the invention it is possible to set up and apply models for how the resist thickness and chrome properties affect the feature size of the pattern and correct for the errors created.

Since these properties are possible to measure by measuring means 513, 514 prior to the writing of the mask, it is possible to predict the errors and correct them at the time of writing the pattern, the feed-forward correction loop 515 in FIG. 5.

Residual Errors

By the feed-forward or feed-back correction 509, or especially a combination of the two, a large portion of the total errors can be controlled and corrected. The residual errors are due to random errors during maskwriting, exposure and processing, and have to be addressed as such, i.e. by better temperature control, vibration-insulation, process automation, etc. They are also due to incomplete error models and uncertainty in the model parameters. We believe that when the framework of the invention is established there will be a development of better and better models until eventually all but the genuine noise errors are removed. The development of models and software for their characterisation and use could well become the mission of independent commercial companies.

A flow chart describing the development of models and how the models are used to predict and correct errors is given in FIG. 6.

A Comprehensive List of Error Sources

Figure 7:
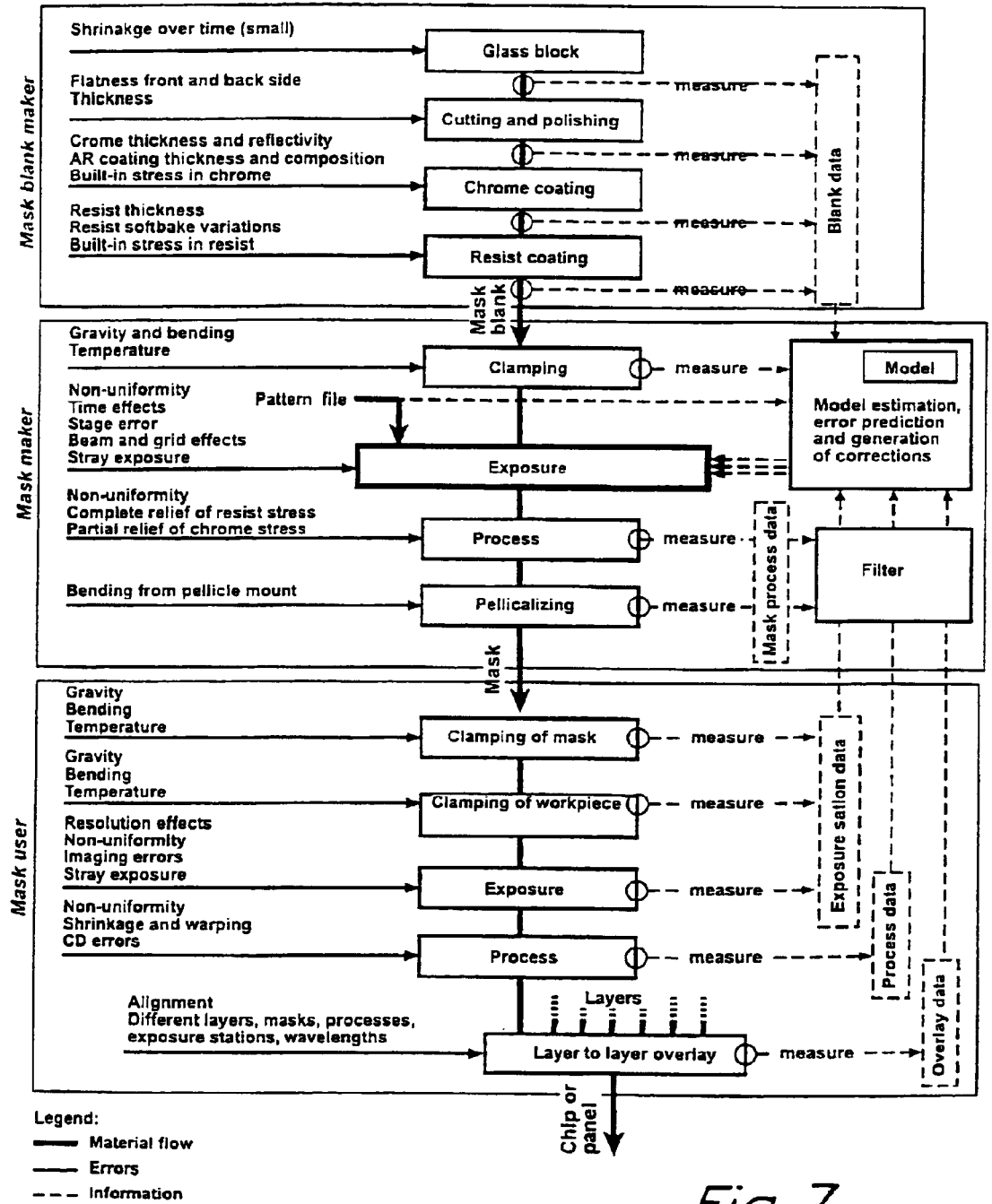
FIG. 7 shows the control method according to FIG. 5 more in detail.

FIG. 7 shows the work flow from glass block and CAD file to a finished chip or TFT display, and important error mechanisms that can be modelled and corrected. The work flow is divided in three separate parts of making the mask blank, writing the mask on the blank, and finally using the mask for lithographic production, and each part is divided in several different steps. For each step is further indicated different types of errors possible to occur during said step. These errors are however merely examples of errors possible to occur during each step, and many other errors are probably possible as well. As is described above, errors in at least some of the steps are measured and used either in a feedback or a feed-forward loop to predict the error in the written pattern, and to generate corrections to compensate for said predicted errors during the exposure step in the mask making.

Correction of Clamping Errors

If is held in exactly the same way during writing and use there is no error. Until now it has been possible to treat the semiconductor mask as a stiff plate with no deformation induced by clamping, provided that the clamping has been done carefully. There are two developments that make the clamping-induced deformation more critical in the future: increased mask size and dramatically tightened precision requirements. The new mask format of 225×225×9 mm has been defined and the allowable geometrical errors in a mask will be 30 nm in 2001 and below 10 nm a few years later. The registration error allowed is typically 5% of the features on the photomask and the error of critical dimensions (CD) must be less than 2.5%. Current plans for lithography predict that the features will be around 25 nm in the year 2010. With a reduction ration of 4 the features are 100 nm on the mask and the registration requirement is then 5 nm and the CD tolerance 2.5 nm. A few years later the requirements are predicted to be sub-nanometric if the march toward smaller scale were to continue. Mask production following what is known in prior art cannot produce masks to these requirements. In the invention methods are devised that can reduce many systematic errors by an order of magnitude or more.

It is known in prior art to support the glass plate at three points. With three supports there is no bending induced by the supports. Therefore it deforms only under gravity. It is also known to correct the pattern geometry for the computed deformation due to the gravitational sag when it is supported on three supports. The deformation depends only on the plate size and its material properties and can be computed beforehand.

In flat panel production the masks may be 600×800×12 mm. It is not possible to support such a large plate on three points and get a sufficiently flat surface. The plate needs to be supported at more than three points and becomes kinematically over-constrained. The supporting structure will introduce deformations if the points are not in a perfect plane. In this case the deformation is a combination of gravitational sag and deformation due to the support structure. The same applies to a co-ordinate measuring machine where the plate needs to be measured without distorsion.

The basic problem is that due to technical constraints different machines producing and using a patterned workpiece hold the workpiece by different methods,: For example a reflection-type metrology system for semiconductor reticles normally uses a three-point support with the support points chosen for minimum deformation, but the stepper using the reticle must support it along the edges to keep the patterned area unobstructed for the exposing light.

If the workpiece or the clamping structure is non-ideal, i.e. non-flat, the different types of clamping in different types of equipment give an uncertainty in the geometry of the workpiece.

A numerical example: assume that a standard semiconductor reticle (152×152×6.25 mm) is supported at the four corners. One of the corners is 1 $\mu$m out of the plane of the other three corners, either because the glass is non-flat or the supporting points are skewed. The bending of the glass causes a line along one diagonal of the plate to be stretched and the other diagonal to be compressed. This is the same as an orthogonality error in the pattern on the mask with a maximum lateral position error on the plate of 0.5 $\mu$m*6.25/2 mm/152 mm=20 nm. The error from the clamping must be added to other error sources such as drift, scale errors and effects from the process. Therefore 20 nm is unacceptable as an error from the clamping alone. And if the points were located closer together or if there were more than four constraining points the errors would be even larger. We have found that supporting a plate on four well chosen points is exceptionally good for large plates, giving a deflection that is 20 smaller than with htree support points. The invention makes it possible to use four points and compute the effect of the plate being overconstrained. If the flatness in force-free state is known and the height of the upper surface is measured at the four point one has all necessary information to correct the pattern for bending and gravitation.

The invention devises a method for complete prediction of the clamping errors as well as partial correction for stress-induced errors in a multi-machine environment with equipment for writing masks, printing panels or wafers from masks and metrology systems for measuring masks, wafers and panels.

DESCRIPTION OF A PREFERRED EMBODIMENT

The mask blanks are cut and polished by a glassmaking company. The surface figure is controlled to a maximum error corresponding to a quality class of the glass product. The glass plate is coated with a sputtered film of chromium and a photoresist coating s spun on. In the preferred embodiment of the invention the flatness of the front and backside of the glass is measured before and after the coating with chrome and after the resist coating. A flatness map is generated for each side together with other auxiliary information such as the exact thickness and the Young's modulus of the glass material. Each glass plate has a serial number engraved at the perimeter of the chrome surface before the chrome coating so that the identity of the plate can be tracked through-out it's lifetime. The serial number is engraved in the glass surface or chrome film in clear text and machine-readable format, e.g. by laser ablation. It is also possible to laser engrave an identity mark inside the volume of the glass or use other marking methods such as magnetic recording in the chrome coating or embedding of a memory devise in the glass plate. Identification of semiconductor wafers by an engraved marking is standard in the semiconductor business, and in the invention the same would be applied to mask blanks. Any other secure identification system can be used, for example storing and shipping the mask blanks in marked and bar-code labelled boxes.

The mask blank maker stores the flatness data for each blank on a computer and the data is published on a network accessible to the mask makers at a later time, e.g. on an Internet server. Alternatively the data could follow the blank, e.g. on a diskette shipped with the blank or on the embedded memory device.

How to measure the flatness and other properties of the mask blank is known in the art. Flatness is often measured by interferometers made by for example the companies Möller-Wedel, Zygo and Tropel. The resist thickness can be measured with spectroscopic reflectometry, ellipsometry and other optical methods. The chrome thickness can be measured by optical transmission or inductive methods and the reflectivity of the chrome layer by reflectometry. The exact thickness can be measured with mechanical or optical methods.

When a mask or reticle is ordered by a semiconductor company the specification includes the serial number of the stepper for which the mask is written. The clamping system of each stepper is characterised by a file of geometrical data describing the method of clamping, but also and most important the individual imperfections of the clamping system. This information is stored on a network accessible to the mask maker or sent to the mask maker together with the order. The mask maker can also pull information about the process, e.g. uniformity data for a etching step from the semiconductor manufacturers computer. Alternatively the data can be attached to the order document as embedded data or as separate documents.

The mask maker who typically have several mask writers of different kind have a similar database of data for his writing systems and processes. He also has empirical data of how the mask is distorted by the application of a pellicle, the stretched film that acts as a dust protection on the finished mask.

When the chrome and resist were applied at the mask blank manufacturer the blank bent due to stress built into the films. When the resist is removed during processing in the mask shop the stress from the resist disappears and the blank goes back to the state it was before the resist was applied. More important is that when a pattern is formed by partial removal of the chrome the stress from the chrome film is partially relieved. With knowledge of the bending caused by the application of the chrome film during manufacture and the pattern to be written it is possible to predict the deformation of the plate by patterning of the chrome.

During the planning of the writing job the mask maker fetches the applicable information for the stepper or exposure station in which the mask will be used, for the maskwriting equipment, for the blank and for the pattern. Using the error model a total combined error can be computed and corrected for, optionally using the MEEF factor or a similar function as a transfer function from correction to result in the finished pattern. In another application of the invention the collected information can be used to select among mask blanks, writing systems and processes. A simple example is the selection of blanks for uniformity for patterns that occupy different areas on the mask. Of course, the principle of the invention is the same whether the end result ("the output") is a chip, a display panel or just the mask.

This contains geometrical information about the clamping geometry, imperfections of the clamping structure and also other known image distorsion created by the tool and subsequent processing.

The Maskwriter

In a preferred embodiment the mask writer has several provisions for correction of distortions caused by the processes chain from patterning to use. First it has a precision stage controlled by laser interferometers with a adjustable scales in x and y, corresponding to uniform shrinkage or expansion plus uniform bending across each axis, such as may result from built-in film stress. Secondly it has adjustments for orthogonality and trapezoidal distorsion, by modification of the driving of the servos servos and by software. For higher order errors such as barrel distorsion, mirror bow and irregularity of the coordinate system, the maskwriting machine has an xy correction map that sends position-dependent offsets to the servo systems. The information collection and error prediction system sends a uniform scale and an xy map to the maskwriter for each mask to be written, said map being the pattern correction necessary to correct for all known errors. These of course include the maskwriter's own stage errors.

Furthermore the maskwriter has a clamping structure that s adapted to the particular type of mask blank to be written. In one embodiment the plate is placed on three supports so that the deformation of the plate in the maskwriter is independent of the plate shape and can be computed easily. For the most accurate correction the supports are placed identically to similar supports in the equipment using the mask, e.g. near two adjacent corners and at the center of the opposite side.

In many cases it is not possible to support the mask plate at three points. Especially for larger-size masks it is necessary to have more than three supports. In this case it is impossible to hold a mask without introducing bending moments, if not both the support structure and the plate are perfectly flat. In one embodiment the forces exerted on the supports from an ideal plate/support structure combination are derived theoretically and the geometry of the supports is adjusted until the force on each support matches the theoretical force. In another embodiment the non-flatness of the plate is known beforehand and the geometry of the clamping structure is modified so as to minimise bending forces. Other deformations such as that from gravitational sag and subsequent process distortion are computed and corrected for.

In another embodiment the support structure is not adjustable but geometrically characterised, so that it is possible to compute the bending of a particular plate resulting from the combination of plate non-flatness and clamping geometry.

I another embodiment the maskwriting system itself is adapted to measure parameters that are needed for the correction, such as the flatness of the substrate. If the flatness is measured after clamping in the maskwriter, the measured data can be used in several ways. First it can be used to check the model of the clamping structure. Secondly it can replace the detailed knowledge of the stage flatness, since the exact form and the clamping deformation can be calculated from the surface flatness combined with flatness data of the substrate. In the case that there is no flatness data available and the plate is known to be flatter than the stage and/or the gravitational sag, the measured deviation from flatness indicates a real deformation and can be used for an approximate correction.

A measurement of other parameters such as resist thickness can also be integrated with the maskwriter, to provide information necessary for the correction independent of the mask blank maker or to be used with in-house spun plates.

The invention can be used in different types of maskwriters using scanning laser beams, spatial light modulators or particle beams.

Exposure Station

Like the maskwriting equipment the exposure station or stepper that is going to use the mask to print the pattern on a workpiece has a number of errors, such as image distorsion in the exposure step and warpage in the subsequent processes. In a preferred embodiment the mask is supported by three supports and the clamming gives no additional bending forces beside the gravitational sag. In another preferred embodiment other design constraints makes it necessary to clamp it kinematically over-restrained, i.e with more than three support points. The pattern distorsion due to the bending forces resulting from imperfect geometry can be cancelled by modification of the clamping structure as in the maskwriter or by prediction and precorrection of the mask.

The geometry and the errors of the exposure station are characterised and stored as a machine parameter file, which contains enough information to compute the errors of a real physical mask and how it is printed. The file may, apart from the identity and bookkeeping information, contain, the number of supports, their xyz coordinates and compliances and optional springloading, further distorsions of the machine's coordninate system etc.

It is also valuable to have a process distorsion file which contains an error map for how an exposed workpiece is distorted by subsequent processing. An example is a glass panel for a TFT-LCD display that may shrink by several tens of ppm in high-temperature steps.

Metrology Tools

The masks and the exposed workpieces are measured in coordinate measuring system, such as those commercially available from the companies Leica and Nikon. The metrology tools also have a clamping geometry and built-in errors that can be described in a machine geometry file. Even though the metrology tool does not impose its errors directly to the mask, it does so indirectly by being the reference against which all other systems are calibrated.

Computing the Bending Forces

A mask blank has a simple geometry and is made from high-quality quarts or glass. Therefore, it can be represented by a simple finite element model as is well known to a person skilled in mechanical design. All errors are small compared to the size of the plate and the resulting errors can be computed by linear superposition of distorsions from different sources, e.g. gravitational sag and bending due to clamping are additive. This allows for simplified methods of analysing the elastic glass plate by decomposition of different bending modes. This is advantageous for real-time correction on an embedded computer in the mask-writer, but it is equally possible to run a full finite element simulation on an embedded computer with adequate memory and power, or at an offline workstation.

Given a machine parameter file, with the geometry of the supports and the orientation of the force of gravity relative to the plate, and a plate parameter file with the geometry, flatness and elastic properties of the plate, the computer can use the finite element model to find the shape of the plate, the distorsion of a pattern on its surface, and the contact forces at the support points.

If there are many support points it is not known beforehand that a particular non-flat plate really makes contact to all supports. It is, however, possible to find which points make contact. In principle the solution has to be self-consistent. The plate makes contact to a support point if there is a positive contact force, including the effect of possible spring-loading. By this method it is also possible to find the approximate area of contact between the mask blank and a flat surface, e.g. a flat stage top, by representing the flat surface by an array of contact points.

Because of the linearity of the elastic plate and the simple geometry it is also possible to derive a simplified set of simultaneous linear equations describing the deformation of the workpiece due to forces at a number of predefined positions on the workpiece. Other positions can be treated by interpolation between the basic computational points. The system of equation is solved for the geometrical constraints given in the geometry files and the bending forces are derived. These are added to the gravitational sag that depends only on where the support points are placed.

Correction of Other Mask Blank Related Errors

Other properties of the mask blank affect the quality of the image, such as the resist thickness, the chrome thickness and the reflectivity of the chrome. These can be measured in the same way as the flatness or in fact in the same equipment.

Implementation of the Correction

Once the errors are predicted and the appropriate corrections are computed there are two principally different methods to apply them. Either the pattern data is modified, e.g. the corner points of each feature are moved, or else the corrections are fed to the writing hardware, such as position servos for placement and modulator or light source for intensity control. The former method is more general and can in principle give arbitrary large corrections. It is also the only possible alternative for shape corrections involving serifs and similar features. For small and slowly varying corrections the second method gives a smoother correction, since it has the resolution of the interferometer while modification of the data only has the resolution of the address grid. A second advantage is that the data can be prepared offline without knowledge of the mask blank and machine specifics and the corrections applied at the time of writing. But for very dense patterns the data preparation has to be done in real time anyway, so there is little difference in logistics whether the correction is applied to the pattern or to the writing hardware. Correcting the pattern is perfectly flexible: corrections can be applied for placement, size and shape and there is no limit to the size or complexity of, the corrections.

Real-time Pattern Correction

With a real-time data path with high processing capacity it is possible and advantageous to apply corrections for beam size or resolution effects and stray exposure together with all other corrections at the time of writing. In a typical implementation there is a bank of parallel processors, possibly organised in groups doing different steps of the data preparation, with up to several hundred CPUs and ASIC:s. The slowly varying corrections, e.g. for clamping distorsion, will not effect the work load or data flow appreciably, but corrections for resolution, beam size and stray effects generate immense amounts of extra data and require processing capacity to match the data flow. However, there is an big advantage to real-time correction and for exactly this reason. The data volumes are difficult to handle with off-line correction. In a commercial mask shop where a maskwriter is running essentially 24 hours a day, there is also no cost benefit of doing the correction off-line, since an equally powerful computer is needed to furnish corrected data to the maskwriter at full writing capacity.

The general concept of pattern correction to compensate for the limited resolution is known in the prior art. In the invention the correction is done in real time as a part of the real-time processing. For real-time correction of resolution, beam size and stray effects the algorithm is preferably running on the maskwriter's embedded processor bank. The control system supplies only the parameters for the interaction between the image formation and the pattern, e.g. a series of superposed gaussian profiles representing the point-spread function or the beam of the writer and exposure system, or a system of rules for the correction. A typical rule is to add a 0.16 m serif to all outer corners in the pattern.

Correction of the imaging properties of the maskwriter is preferably done transparently, with parameters that are fitted to that particular maskwriter and process but otherwise not changing. Once the parameters are set up the user will not need to care, or even know, about the correction, but will only see a mask pattern with a more accurate representation of the input data.

Pattern correction for the exposure station is preferably done in collaboration between the mask shop and the chip or panel manufacturer. The manufacturer prints some test patterns that are designed for extraction of the model parameters. Once the model parameters are set the correction could be transparent and automatically applied to all designs. The information system of the invention pulls the parameters together with clamping data and image distorsion when the writing job is set up. Or alternatively the manufacturer would explicitly provide another set of correction parameters, or correct the data directly using his own correction model. However, we believe that the design of image correction models, design of test patterns and extraction software will be the mission of specialist consulting companies, and that the manufacturer will use the system in the transparent mode. The information system of the invention provides the framework, which makes such transparent operation possible and convenient.

Figure 9:
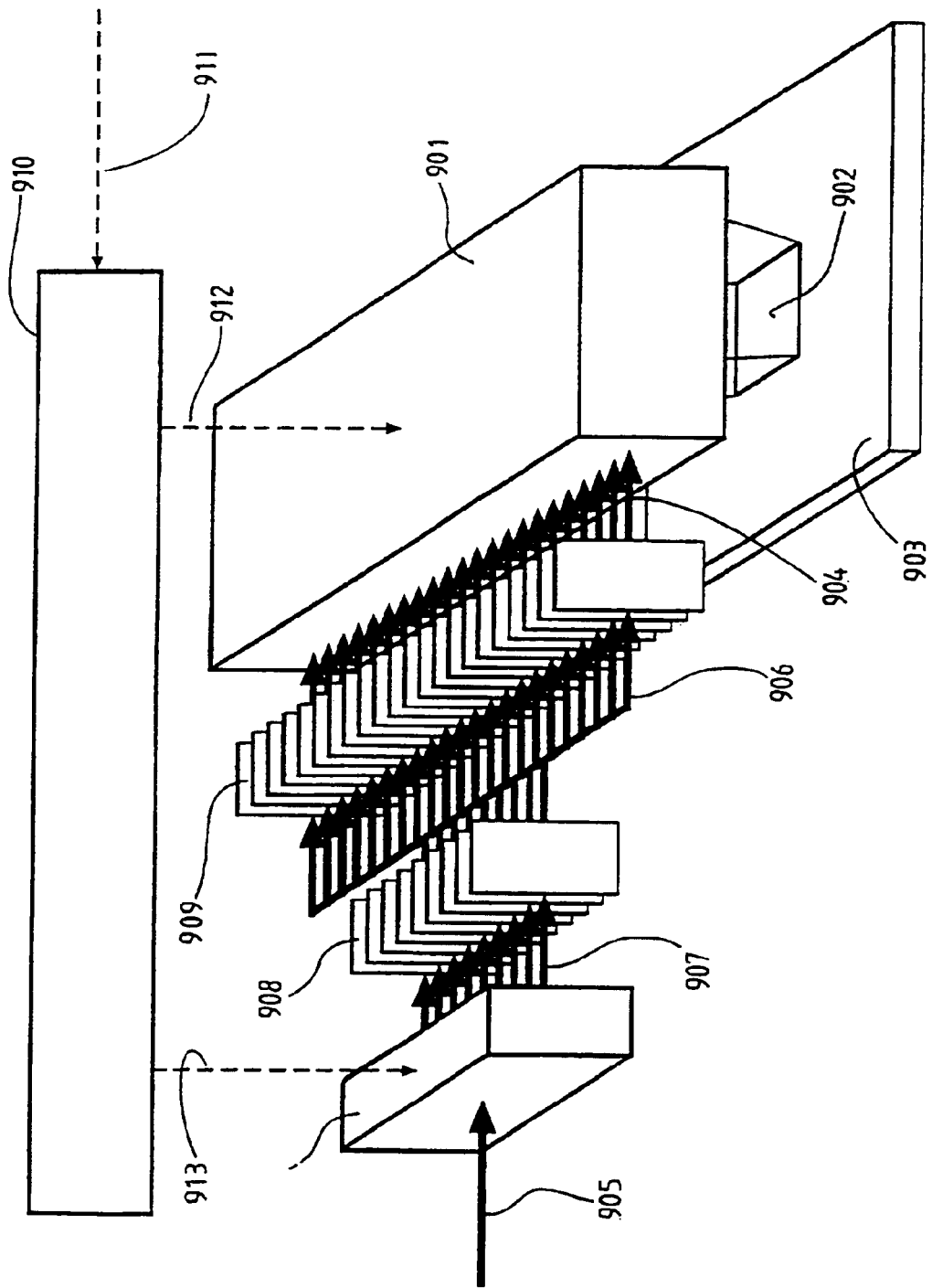
FIG. 9 shows a typical implementation of an error correction system suitable for the invention using both pattern modification and writing hardware control.

FIG. 9 shows a typical implementation of an error correction system suitable for the invention using both pattern modification and writing hardware control. The writing hardware 901 prints a pattern 902 on the mask blank 903 using a low-level representation of the pattern 904, e.g. a bitmap or a decomposition into small area elementary forms such as trapezoids. The low-level format is created from a geometrical database with a high-level is input 905, containing a geometrical description of the pattern, such as a list of filled polygons. Since the input format can contain the geometrical features in any order and they can have any shape they are pre-processed into an intermediate format 906 after having been distributed 907 from the external file interface 913 on a number of parallel processors 908. For each conversion step the data volume expands and the necessary processing power increases. Therefore the final processing needs more parallel processing units 909 than the pre-processing. The error correction system has a control unit that predicts the errors from the collected error data and computes an appropriate pre-compensation based on its set of models and rules. The correction of small slowly varying size and placement errors is sent 912 to the writing hardware, especially to the dose control and the position servos. Pattern corrections are sent in the form the correction rules to the datapath interface 913 and run on the embedded computer banks 908 and 909. Even the pattern corrections can take different forms and several correction algorithms can be run at different conversion steps. For example, correction for the beam size effects in the mask generator is suitable to run at the last stage of the conversion, while the larger serifs needed to compensate for the imaging effects in the stepper are added to the pattern during the pre-processing step.

For efficiency it is suitable for the different processors to work on separate areas of the pattern, but to apply corrections for non-local imaging effect the processor needs to know the pattern in an area around the actual point it is working in. Therefore the pattern is cut into partly overlapping computation fields. The redundant information is only used for the correction and discarded after use. For faster processing of non-local information, e.g. for correction of stray exposure, a temporary representation of the pattern at a lower resolution is created and used to compute background exposure. It is possible to use more than one low-resolution representation at a single time to represent phenomena at different length scales.

In one embodiment the two processing steps are complemented with a third step that runs on a separate bank of processors essentially dedicated to pattern correction.

In a preferred embodiment of the invention two correction maps are computed, one for position and one size. The position map has the form of a table with x and y deviations given at a grid of points. For a given stage position the corresponding s and y correction is computed by interpolation in the correction map and the result is fed as an offset to the position servos. The same method is used for finding the correction of CD errors by interpolation in the CD map.

In a different embodiment the correction maps are computed and made available to the datapath. During the conversion from pattern database to hardware-driving signals both position and size is corrected. In the preferred embodiment, which has a stripe-organised writing strategy, it is done at the fracture step, just before the pattern is divided into strips. The vortex points of the pattern elements are simply moved according to the interpolated correction maps. Most pattern elements have edges parallel to the axises, and would after the correction have slanted lines, but since the scale of the corrections is normally of the order of a part per million or less, all but a few edges are still parallel to the axises after their coordinates have been truncated to the resolution of the data preparation software, e.g. 0.1 nm. Before writing they are further truncated to the address grid of the writer, e.g. 4 nm for semiconductor reticle at a specific specification level. The written pattern will have the smooth curves of the correction map snapping to the address grid, but with an appropriately chosen address grid this will give a negligible contribution to the error statistics.

The Information System

An information system is built to manage the lithography errors in the chain from mask blank maker to user of the final products. The hub in the information system is the mask maker where during job planning all information is collected and used to predict errors and precompensate them.

A convenient way to organise the information when several parties are involved, e.g. mask blank makers, mask shops and mask users, is to have each party maintain its own information and store it on its own computer system. The computers are accessible from the mask maker's computer by remote access over phone line, ISDN, high-speed link or the Internet. In the latter case it is important that the integrity of the information is validated, so that the user or information knows it is complete, unaltered and issued by the correct sender. The parties involved may also want to have it confidential. All this can be assured in modern communication links by appropriate use of passwords, encryption, check figures and digital signatures.

Workflow

It is the responsibility of the mask shop to find the necessary corrections that will make a particular reticle print without systematic registration errors. The customer, i.e. the mask user, provides one or more pattern files and the order document requests any special treatment, metrology etc. In a preferred embodiment of the invention the order document specifies the exposure station where the mask will be used and optionally also a process error description. During job planning and set-up the mask maker's computer accesses the data from the mask user, data which specifies the geometry of the exposure station, including known imperfections, and image distorsions. Optionally the machine file also includes a map of size errors created by the exposure step. If a process file has been specified in the order document, it specifies warping of the workpiece during subsequent processing and optionally also size errors created by the process. For example a plasma etching step is sensitive to the "loading", i.e. the local density of pattern area exposed to the plasma, and etches differently along the edges of a chip. Since this is a systematic behaviour that is repeated more or less in every design it can be partly corrected for in the mask using information about said mask.

When the writing job is planned a mask blank is assigned to the mask. The computer accesses the data storage at the mask blank maker or a local storage with information files for the blanks that are in stock. The information file fetched corresponds to the particular mask blank that will be used for writing the mask, and holds information about the exact size and thickness as well as relevant physical material properties. It also contains flatness data, resist thickness, chrome thickness and reflectivity and data relating to the bending force created by built-in stress in the chrome and resist. The scheme is, of course, independent of the exact materials used, and other types of existing or future mask blanks can be handled in a similar fashion.

Data Fine Formats

The data file formats are designed to be extendable by having the data fields tagged with keywords. A new feature can be included after definition of a new keyword and old data files will still be compatible. For simplicity the data files in the preferred embodiment are ASCII character files. This allows for simple debugging and files can be modified or created in any text editor or spread-sheet program. To avoid the risk of inadvertent change of a file it is locked by a checksum and validated by a digital signature. For machine-generated files these are generated automatically, but hand edited files need to get the checksum and signature added by a special validation program. This gives a reasonable trade-off between security and flexible engineering and debugging. For encryption any commercial encryption program can be used.

Example of a System Using an Embodiment of the Inventive Method

A system for producing large-area displays with distortion control according to an embodiment of the invention should now be described more thoroughly.

Figure 10:
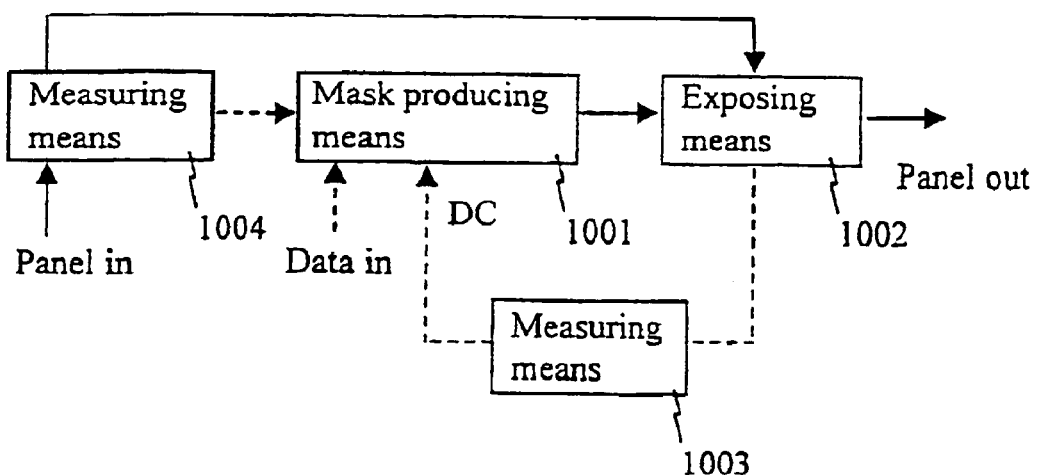
FIG. 10 is a schematic view of a system according to one embodiment of the invention.

Referring to FIG. 10, an embodiment of the system for producing large area display panels according to the invention is shown. The system could be used for producing shadow masks for conventional CRT (Cathode Ray Tube) displays, but is especially useful for producing TFT (Thin Film Transistor), CF (Color Filter), PDP (Plasma Display Panel) or PALC (Plasma-addressed liquid crystal) displays.

The system comprises a first mask producing means 1001 for producing a mask with a predetermined pattern according to input data. The mask producing means is preferably a microlithographic writing device for writing with high precision on photosensitive substrates. The term writing should be understood in a broad sense, meaning exposure of photoresist and photographic emulsion, but also the action of light on other light sensitive media such as dry-process paper, by ablation or chemical processes activated by light or heat. Light is not limited to mean visible light, but a wide range of wavelengths from infrared to extreme UV. Such a mask producing apparatus is previously known from e.g. EP 0 467 076 by the same applicant. In general the apparatus comprises a light source, such as a laser, a first lens to contract the light beams, a modulator to produce the desired pattern to be written, the modulator being controlled according to input data, a reflecting mirror to direct the beams towards the substrate, and a lens to contract the beams before it reaches the substrate. The mirror is used for the scanning operation to sweep the beam along scan lines on the substrate. Instead of a mirror, other scanning means may be used, such as a rotating polygon, rotating prism, rotating hologram, an acousto-optic deflector, an electro-optic deflector, a galvanometer or any similar device. It is also possible to use raster scanning or spatial light modulators. Further, the substrate is preferably arranged on an object table which has a motion in two orthogonal directions relative to the optical writing system, by means of two electrical servo motors.

The system according to the invention further comprises microlithographic exposing means 1002 for exposing a photosensitive panel substrate with light and with use of the mask to impose the pattern of the mask on the substrate, whereby said substrate has a layer being sensitive to said light. Several such exposing means are also previously known in the art. The exposing means could be of the contact copy type, proximity exposure type, or a projection aligner. The system according to the invention could also be used in a direct writer, whereby the compensation is not made in a physical mask, but in a data mapping controlling the writing beam. For TFT and CF display panels projection aligners are usually used, and for PDP and PALC the contact or proximity type are frequently used.

Furthermore, the system comprises measuring means 1003 for measuring the pattern on the substrate and detecting deviations relative to the intended pattern as given by the input data. This could be done by measuring the geometrical position of the pattern, preferably at some reference positions, to get a so called registration mapping, and compare it with the intended pattern which is deducible from the input data. Further, the width of lines in the pattern, the so called CD (Critical dimension), could be measured. Measuring equipment is commercially available, and for example the equipment could comprise a CCD-camera or be based on interferometry.

From the measuring means 1003 a distortion control signal is sent to a second mask producing means 1004. This second mask producing means could be a separate apparatus, but is preferably the same as the first mask Producing means 1001. This second mask producing means is fed with input data describing the intended mask pattern to be written, and is also fed with the distortion control signal from the measuring means 1003, whereby the writing process for producing the second mask is controlled to modify the pattern to compensate for the measured deviations, and thus compensate for production distortions. The measurement is preferably made after the subsequent processing steps or the panel as well, i.e. the development, blasting and/or etching, whereby systematic errors from theses processes are taken care of in the compensation as well.

The compensation in the mask writer could be accomplished in different ways. In a writer of the type described above, with an object table continuously moving in a slow strip direction and a scanner sweeping in a fast scanning direction, the compensation could be made according to a surface mapping. According to this mapping the compensation in the scanning direction could be accomplished by e.g. offsetting the starting time of the beam during the scanning. In the stripe direction the compensation could also be made by time offsets, either directly or indirectly by means of different ramp functions. There are also other possible way to accomplish such compensation. For example the compensation could be made by controlling the servo motors for the object table, by adjustment of the time dependent angle of the scanners, by changing the input data or by controlling an internal control unit such as piezoelectrically controlled mirrors.

However, if a direct writer is used, the same type of compensation could be made in real time.

Compensation for deviations in the line width, CD, could be accomplished in the same way as deviations in the registration. However, this compensation could also be made by changes in the power of the writing beam, i.e. the exposing dose, by changing the laser output or having an analog modulator. This compensation could be accomplished by means of a herefore adapted dose mapping to control the dose.

When the second mask is used in the same exposing means 1002 all systematic errors depending on different temperature conditions, errors in the exposing means etc., are compensated for, and the pattern precision of the produced display panels are greatly improved.

The first mask could either contain the same pattern as the intended pattern for the second mask, i.e. the pattern not being compensated, or contain a reference pattern, intended for deviation measure only.

Further, error data could be accumulated, and a rolling means value could be used for the compensation. The error compensation could also be a combination of several different part error compensations. Those part compensations could be based on the premises for the process, e.g. which stepper and type of glass that is being used. Hereby the total error compensation could be a combination of one or several error compensations for each process step.

Above, a system for passive distortion control has been described. In this system compensation is made for the processes and equipment being used in the system. However, the compensation is not adapted for different panel substrates. In this passive system a measurement to alter the distortion compensation is preferably made once for every new batch of substrates, and thereafter the same mask is used for producing all the panels in the batch. This passive distortion control is specifically useful for production of TFT or CF displays. The requested precision for the patterns on the mask for this production is extremely high, and the masks are very difficult, and thereby expensive, to manufacture. On the other hand the masks last for a long time in this production.

The system according to the invention could also comprise second measuring means 1004 for measuring the thickness of the light sensitive layer on the substrate prior to the exposure, whereby said measurement is also used for said compensation. Hereby the compensation is adapted for varying resist layers between different batches of substrates. Such batch wise compensation could also be accomplished with use of data specified by the manufacturer.

This second measuring means 1004 could also be used for measuring each and every panel substrate that is going to be exposed, and thereafter adapt the process for each individual panel. Hereby the system could compensate for varying glass quality in different panels, varying thickness and quality of the resist or emulsion of the substrate area, different form variations etc. This active distortion control is especially useful for production of PDP or PALC display panels, where the masks are comparably easy and inexpensive to produce. This method could also be used for direct writers.

In the active distortion control the panel is initially measured, regarding e.g. resist thickness. Many such measuring methods are available for someone skilled in the art, e.g. a test exposure, dosimetry, of the substrate with different doses, by profilometry, interferometry, confocal microscopy, by an interferometric method or the like. The shame of the substrate could also be initially measured, and this could be accomplished by known methods such as moire interferometry, projected fringes, laser triangulation, ordinary interferometry etc. Preferably already existing patterns are also initially measured, whereas such exists. Display panels are usually exposed in several separate steps, typically 3–7 exposing steps, and normally the same exposing station is used for all the exposures. By writing masks with compensation for individual errors in different station the display producer could schedule the production more freely, independent of which stations that is used. This is of great importance for making the production more efficient and the utilisation of the stations better.

Figure 11:
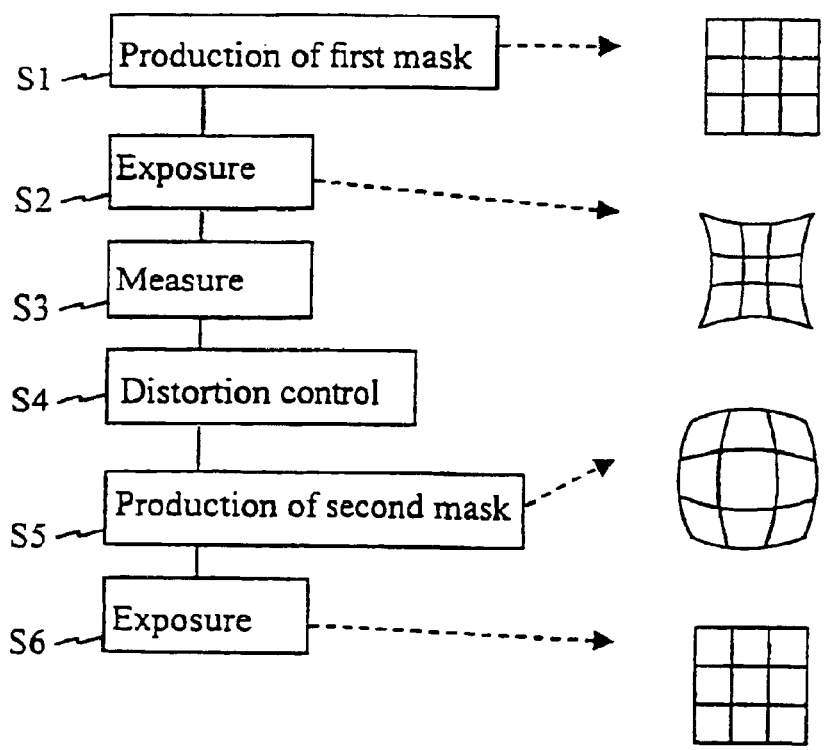
FIG. 11 is a schematic flow chart of the method used in the system according to FIG. 10.

Referring now to FIG. 11, a method for producing large area display panels according to the invention, and with use of the above-mentioned system will be described.

The method according to the invention comprises a first step S1 in which a mask with a predetermined pattern according to input data is produced. Thereafter the mask is used for microlithographically exposing a photosensitive substrate with light to impose the pattern of the mask on the substrate, whereby said substrate has a layer being sensitive to said light, in step S2. The exposed pattern is then measured, possibly after several subsequent processing steps, or even in the finished product, in S3, to detect deviations of the exposed pattern relative to the intended pattern as given by the input data. In step S4 a distortion control mapping is then produced, to be used in step S5 during production of a second mask having a pattern according to input data and modified to diminish the measured deviations, and thus to compensate for production distortions. In the last step S6 the second modified mask is then used in a photolithographic fabrication of display panels. Similar compensation may be used in a direct writer, where the compensation could be made in a data mapping.

The invention shall not be limited to the embodiments described above, which are only examples of implementation. For example what is said above about chrome-on-glass masks is equally applicable to masks made from other materials, e.g. with coatings of other metals, iron oxide, diamond-like carbon, multilayer coatings etc., and with other substrate materials such as calcium fluoride, Zerodur, silicon etc, as well as for both transmissive and reflecting masks and masks which work by scattering. It is also applicable to stencil masks and membrane masks for particle-beam and x-ray lithography.

What is claimed is:

1. A method for predicting and correcting geometrical errors in lithography using masks, including large-area photomasks or reticles, and exposure stations, including wafer steppers or projection aligners, printing the pattern of said masks on a workpiece, including a display panel or a semiconductor wafer, comprising the steps of providing a mask substrate, providing a pattern data file, providing a mask writer for writing said pattern onto said mask substrate, collecting information about the mask writer or the mask writer and any of the mask substrate and the exposure station;

predicting from said information distorsions that will occur in the pattern, when it is subsequently printed on the workpiece calculating from said prediction a correction map to diminish said predicted distorsion, and exposing said pattern onto said mask substrate while applying said correction map for said distorsions;

wherein said information about the mask writer includes information relating to at least one of a mask blank clamping structure, a mask writer exposure, a mask writer process and a mask writer pellicalizing;

wherein said collected information further includes information about at least one error source selected from a group of error sources including: gravity and bending errors from mask blank clamping, non-uniformity errors in the mask blank exposure, time effect errors in the mask blank exposure, stage errors in the mask blank exposure, beam and grid effect errors in the mask blank exposure, stray exposure errors, non-uniformity errors in the mask writer process, complete relief of resist stress errors, partial relief of chrome stress errors and bending errors from pellicle mount.

2. The method according to claim 1, wherein the information being collected is information about the geometry and elastic properties of the mask substrate.

3. The method according to claim 2, wherein the collected geometry information comprises information relating to the flatness of the front and/or backside of the mask substrate.

4. The method according to claim 2, wherein the collected geometry information comprises information relating to the thickness of the mask substrate and/or shrinkage over time of the mask substrate.

5. The method according to claim 1, wherein the collected information comprises information relating to the properties of the resist on the mask substrate.

6. The method according to claim 1, wherein the collected information comprises information relating to the properties of chrome coating on the mask substrate.

7. The method according to claim 6, wherein the properties of the chrome coating is at least one property selected from the group of properties including: chrome thickness, chrome reflectivity, AR coating thickness, AR coating composition, built-in stress in the chrome coating.

8. The method according to claim 1, wherein the method further comprises providing a mathematical model of the mask substrate, including a finite element model, whereby the prediction of the distortions occurring in the pattern as well as the calculation of the correction is done by means of the mathematical model.

9. The method according to claim 1, wherein said mask substrate further is associated with an identification code, and the physical properties of said mask substrate is measured and stored as a data file, whereby the step of predicting the distortions occurring in the pattern comprises reading of said identification code for said selected mask substrate and fetching the corresponding data file and predicting by means of a model describing the behavior of the mask substrate and by means of said data file the distortions occurring in the pattern printed on the workpiece.

10. The method according to claim 1, wherein said information about said mask writer process and/or said mask writer pellicalizing is filtered, and whereby the prediction is a comparison between said filtered information and an intended result, generating an error map, and said correction is made by applying the inverse of said error map.

11. The method according to claim 1, wherein said information about the exposure station comprises information relating to at least one of a mask clamping structure, a workpiece clamping structure, an exposure station exposure, an exposure station process and layer-to-layer overlay.

12. The method according to claim 11, wherein said information about the exposure station comprises information about at least one error source selected from a group of error sources including: gravity and bending errors from clamping of the mask, temperature errors from clamping of the mask, gravity and bending errors from clamping of the workpiece, temperature errors from clamping of the workpiece, errors from resolution effects in exposure station exposure, non-uniformity errors in exposure station exposure, imaging errors in exposure station exposure, stray exposure errors in exposure station exposure, non-uniformity errors in exposure station process, shrinkage and warping errors in exposure station process, CD errors in exposure station process, alignment errors in layer-to-layer overlay and errors due to different layers, masks, processes, exposure stations and wavelengths in layer-to-layer overlay.

13. The method according to claim 1, where the coordinate system of the mask writer is modified to produce an essentially error-free coordinate system at a later time, including at a flat panel produced by printing from the photomask.

14. The method according to claim 1, whereby the step of collecting information comprises the sub-steps of:

measuring a result of process relating to the mask writer and/or measuring the result of a process relating to the exposure station, and filtering said result, whereby the prediction is a comparison between said filtered result and the intended result, generating an error map, and the correction is made by applying the inverse of said error map to the input of said process.

15. The method according to claim 1, wherein said correction map comprises pattern element size corrections for correction of the data provided from the pattern data file, for correction of said distortion.

16. The method according to claim 1, wherein said correction map comprises pattern element position corrections for correction of the data provided from the pattern data file, for correction of distortion.

17. The method according to claim 15 or 16, wherein the calculation of the corrections of the data provided from the pattern data file according to the correction map is made in at least two parallel processing means.

18. The method according to claim 1, wherein said correction map comprises pattern element position corrections for correction of the position control for a servo system used to position the pattern on the substrate.

19. The method according to claim 1, wherein said correction map comprises pattern element size corrections for correction of the dose provided during the exposure.

20. The method according to claim 19, wherein the correction of the dose is made by means of a dose modulator.

21. The method according to claim 1, whereby the step of collecting geometrical information comprises the sub-steps of:
collecting a first set of information about at least one of the following:
the geometry of a mask writer,
the geometry of an exposure station;
collecting a second set of information about at least one of the following:
the layout of the pattern,
measured flatness of the mask substrate; and
wherein a mathematical model for the interaction of the first and second set of information is provided, and the prediction of pattern errors is made by means of the mathematical model operating on said first and second set of information.

22. The method according to claim 1, wherein the step of collecting information further comprises collection of information about non-uniformities in the behavior of a processing step that will occur after the writing of the mask.

23. A method for predicting and correcting geometrical errors in lithography using masks, including large-area photomasks or reticles, and exposure stations, including wafer steppers or projection aligners, printing the pattern of said masks on a workpiece, including a display panel or a semiconductor wafer, comprising the steps of
providing a mask substrate,
providing a pattern data file,
providing a mask writer for writing said pattern onto said mask substrate,
collecting information about at least one of the following:
the mask substrate
the mask writer, and
the exposure station;
predicting from said information distorsions that will occur in the pattern, when it is subsequently printed on the workpiece
calculating from said prediction a correction map to diminish said predicted distorsion, and
exposing said pattern onto said mask substrate while applying said correction map for said distorsions;
wherein said information about the mask writer includes information relating to at least one of a mask blank clamping structure, a mask writer exposure, a mask writer process and a mask writer pellicalizing;
wherein said information about the mask writer further includes information about at least one error source selected from a group of error sources including: gravity and bending errors from mask blank clamping, non-uniformity errors in the mask blank exposure, time effect errors in the mask blank exposure, stage errors in the mask blank exposure, beam and grid effect errors in the mask blank exposure, stray exposure errors, non-uniformity errors in the mask writer process, complete relief of resist stress errors, partial relief of chrome stress errors and bending errors from pellicle mount,
wherein the collected information comprises information relating to the properties of the resist on the mask substrate, and
wherein the information relating to the properties of the resist on the mask substrate comprises information relating to resist thickness, resist softbake variations, built-in thickness, and stress in the resist.

24. A method for predicting and correcting geometrical errors in lithography using masks, including large-area photomasks or reticles, and exposure stations, including wafer steppers or projection aligners, printing the pattern of said masks on a workpiece, including a display panel or a semiconductor wafer, comprising the steps of
providing a mask substrate,
providing a pattern data file,
providing a mask writer for writing said pattern onto said mask substrate,
collecting information about at least one of the following:
the mask substrate
the mask writer, and
the exposure station;
predicting from said information distorsions that will occur in the pattern, when it is subsequently printed on the workpiece
calculating from said prediction a correction map to diminish said predicted distorsion, and
exposing said pattern onto said mask substrate while applying said correction map for said distorsions;
wherein said information about the mask writer includes information relating to at least one of a mask blank clamping structure, a mask writer exposure; a mask writer process and a mask writer pellicalizing;
wherein said information about the mask writer further includes information about at least one error source selected from a group of error sources including: gravity and bending errors from mask blank clamping, non-uniformity errors in the mask blank exposure, time effect errors in the mask blank exposure, stage errors in the mask blank exposure, beam and grid effect errors in the mask blank exposure, stray exposure errors, non-uniformity errors in the mask writer process, complete relief of resist stress errors, partial relief of chrome stress errors and bending errors from pellicle mount,
wherein the method further comprises providing a mathematical model of the mask substrate, including a finite element model, whereby the prediction of the distortions occurring in the pattern as well as the calculation of the correction is done by means of the mathematical model; and
wherein said mask writer and/or said exposure station comprises a clamping structure for holding said mask substrate and/or workpiece, said information about the mask writer comprises information about geometrical properties about said clamping structure and whereby said mathematical model used in the prediction step combines said collected information with the geometrical properties of the clamping structure.

25. The method according to claim 24, wherein the predicted clamping distortion is merged with other predicted distortions, including distortion due to exposure tool imperfection and shrinkage distortion due to high-temperature baking of the workpiece, and the predicted sum of the distortions is corrected for.

26. A method for predicting and correcting geometrical errors in lithography using masks, including large-area photomasks or reticles, and exposure stations, including wafer steppers or projection aligners, printing the pattern of said masks on a workpiece, including a display panel or a semiconductor wafer, comprising the steps of providing a mask substrate, providing a pattern data file, providing a mask writer for writing said pattern onto said mask substrate, collecting information about at least one of the following:
information about the mask substrate
information about the mask writer, and
information about the exposure station;

predicting from said information distorsions that will occur in the pattern, when it is subsequently printed on the workpiece calculating from said prediction a correction map to diminish said predicted distorsion, and exposing said pattern onto said mask substrate while applying said correction map for said distorsions;
wherein said information about the mask writer includes information relating to at least one of a mask blank clamping structure, a mask writer exposure, a mask writer process and a mask writer pellicalizing;
wherein said information about the mask writer further includes information about at least one error source selected from a group of error sources including: gravity and bending errors from mask blank clamping, non-uniformity errors in the mask blank exposure, time effect errors in the mask blank exposure, stage errors in the mask blank exposure, beam and grid effect errors in the mask blank exposure, stray exposure errors, non-uniformity errors in the mask writer process, complete relief of resist stress errors, partial relief of chrome stress errors and bending errors from pellicle mount,
wherein at least a first lithographic machine is arranged to print a pattern on said mask substrate thereby producing a mask, and at least a second lithographic machine is arranged to print a pattern on said workpiece, using said mask,
said at least first lithographic machine comprises a first clamping structure for holding said mask substrate,
said at least second lithographic machine comprises at least a second clamping structure for holding said mask,
wherein at least one of said clamping structures being kinematically overdetermined, comprising the additional steps of:
providing a numerical computer model describing the geometry of said workpiece;
further characterizing and providing data for said over-determined clamping structure and,
using the model for said workpiece and the data for said clamping structure to compute the distortion of the pattern due to different clamping in said lithographic machines.

27. The method according to claim 26, wherein said second lithographic machine comprises a third clamping structure for holding said workpiece.

28. The method according to claim 26 or 27, wherein a third lithographic machine is arranged to print a pattern on said workpiece, said second lithographic machine prints at least a first layer on said workpiece and said third lithographic machine prints at least a second layer on said workpiece,
said third lithographic machine comprises at least a fourth clamping structure for holding said mask and a fifth clamping structure for holding said workpiece.

29. A pattern correction system for predicting and correcting geometrical errors in lithography using masks, including large-area photomasks or reticles, and exposure stations, including wafer steppers or projection aligners, printing the pattern of said masks on a workpiece, including a display panel or a semiconductor wafer, comprising:
communication and storage means for retrieving and storing geometrical information about the mask writer or the mask writer and any of the mask substrate and exposure station;
a computing unit for predicting an error map arising from the combined geometrical information using a mathematical model;
wherein said information about the mask writer includes information relating to at least one of a mask blank clamping structure, a mask writer exposure, a mask writer process and a mask writer pellicalizing;
wherein said geometrical information further includes information about at least one error source selected from a group of error sources including: gravity and bending errors from mask blank clamping, non-uniformity errors in the mask blank exposure, time effect errors in the mask blank exposure, stage errors in the mask blank exposure, beam and grid effect errors in the mask blank exposure, stray exposure errors, non-uniformity errors in the mask writer process, complete relief of resist stress errors, partial relief of chrome stress errors and bending errors from pellicle mount.

30. The pattern correction system according to claim 29, wherein the error map is in a form to be used for error compensation control in writing hardware in the mask writer.

31. The pattern correction system according to claim 29, wherein the error map is in a form to be used for error compensation control of the pattern to be written in the mask writer.

32. A pattern correction system to be used with a mask writer which comprises different processors to work on separate areas of the pattern according to claim 31, wherein the error map comprises correction rules to be used for error compensation control in the individual processors of the mask writer.

33. The pattern correction system according to claim 29, wherein the communication and storage means further are adapted for retrieving and storing geometrical information a material processing step.

34. A control system for predicting and correcting placement and size errors in lithography using masks, including large-area photomasks or reticles, and exposure stations, including wafer steppers or projection aligners, printing the pattern of said masks on a workpiece, including a display panel or a semiconductor wafer, comprising:
first computing means, and
second computing means being connected to information-gathering means for gathering information about the mask writer or the mask writer and any of the mask substrate and exposure station;

where said second computing means comprises a storage means for storing said information, means for transferring said information from said second computing means to said first computing means, where said first computing means comprises a mathematical error prediction model to generate an error correction map using said information, the correction being intended for controlling the mask making process;

wherein said gathered information about the mask writer includes information relating to at least one of a mask blank clamping structure, a mask writer exposure, a mask writer process and a mask writer pellicalizing;

wherein said information further includes information about at least one error source selected from a group of error sources including: gravity and bending errors from mask blank clamping, non-uniformity errors in the mask blank exposure, time effect errors in the mask blank exposure, stage errors in the mask blank exposure, beam and grid effect errors in the mask blank exposure, stray exposure errors, non-uniformity errors in the mask writer process, complete relief of resist stress errors, partial relief of chrome stress errors and bending errors from pellicle mount.

35. The control system according to claim 34, wherein the error map is in a form to be used for error compensation control in writing hardware in the mask writer.

36. The control system according to claim 34, wherein the error map is in a form to be used for error compensation control of the pattern to be written in the mask writer.

37. A control system to be used with a mask writer which comprises different processors to work on separate areas of the pattern according to claim 36, wherein the error map comprises correction rules to be used for error compensation control in the individual processors of the mask writer.

38. The control system according to claim 34, wherein the second computing means further is connected to information-gathering means for gathering information about a material processing step.

* * * * *